US012666913B2

(12) United States Patent
Park et al.

(10) Patent No.: US 12,666,913 B2
(45) Date of Patent: Jun. 23, 2026

(54) SEMICONDUCTOR LINE LOGISTICS PROCESSING SYSTEM AND METHOD

(71) Applicant: SEMES CO., LTD., Chungcheongnam-do (KR)

(72) Inventors: Tae Uk Park, Chungcheongnam-do (KR); Hyun Joon Yoon, Chungcheongnam-do (KR); You Seung So, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 416 days.

(21) Appl. No.: 18/222,305

(22) Filed: Jul. 14, 2023

(65) Prior Publication Data

US 2024/0021455 A1     Jan. 18, 2024

(30) Foreign Application Priority Data

Jul. 15, 2022     (KR) ........................ 10-2022-0087776

(51) Int. Cl.
H10P 72/30          (2026.01)
(52) U.S. Cl.
CPC ...... H10P 72/3218 (2026.01); H10P 72/3221 (2026.01)

(58) Field of Classification Search
CPC ...................... H01L 21/67733; H01L 21/6773
See application file for complete search history.

(56) References Cited

U.S. PATENT DOCUMENTS

2008/0281456 A1 * 11/2008 Chen .................. G05B 19/4189
                                                              700/112

FOREIGN PATENT DOCUMENTS

KR          20130039874 A  *  4/2013  ....... H01L 21/67173
KR      10-2018-0042152        4/2018
KR          20230101532 A  *  7/2023  ........... B65G 1/0457

* cited by examiner

*Primary Examiner* — Gene O Crawford
(74) *Attorney, Agent, or Firm* — WOMBLE BOND DICKINSON (US) LLP

(57)          ABSTRACT
A semiconductor line logistics processing system and method are provided. A semiconductor line logistics processing method includes selecting a first line facility including a first control module for logistics transfer within a semiconductor line; interlocking a second line facility including a second control module for the logistics transfer with the first line facility; and performing the logistics transfer by the OHT unit between the first line facility and the second line facility, wherein the OHT unit is operated in an auto routing method under the control of the main control unit for logistics transfer in a direct method between the first line facility and the second line facility.

14 Claims, 7 Drawing Sheets

1

SEMICONDUCTOR LINE LOGISTICS PROCESSING SYSTEM AND METHOD

CROSS-REFERENCE TO RELATED APPLICATION

This application claims priority from Korean Patent Application No. 10-2022-0087776 filed on Jul. 15, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor line logistics processing system and method.

2. Description of the Related Art

In the configuration of a large-scale FAB, it is necessary to operate (OHT movement, transport response, etc. of) a plurality of OHT control systems (OCSs) separated from each other. To this end, it is necessary to automate a switching of setting values related to networks, maps, and the like. To this end, it is necessary to apply automated routing. In addition, through this, it is necessary to operate OHT such as transfer and conveyance between different separate facilities in non-stop.

RELATED ART DOCUMENT

Patent Document (Patent Document 1) Korean Patent Laid-Open Publication No. 10-2018-0042152

SUMMARY

Aspects of the present disclosure are to perform an operation (OHT movement, transport response, etc.) of a plurality of OCSs separated from each other in the configuration for a large-scale FAB manufacturing process, and to smoothly perform logistics processing in a semiconductor line through this.

In addition, aspects of the present disclosure are to smoothly perform the logistics processing in the semiconductor line by automating a switching of setting values related to networks, maps, and the like.

In addition, aspects of the present disclosure are to smoothly perform the logistics processing in the semiconductor line by applying automated routing.

In addition, aspects of the present disclosure are to smoothly perform the logistics processing in the semiconductor line by an operation of OHT such as transfer and transport between different separate facilities in non-stop.

In addition, aspects of the present disclosure are to efficiently operate the OHT by real-time relocation of an upper system in response to an increase in an amount of transport in another line.

In addition, aspects of the present disclosure are to increase an operation rate by reducing an input/output time of OHT and to reduce man-hours through an automatic switching.

Aspects of the present disclosure are not limited to the above-mentioned aspects. That is, other aspects that are not mentioned may be obviously understood by those skilled in the art from the following specification.

According to an aspect of the present disclosure, there is provided a semiconductor line logistics processing method including: selecting a first line facility including a first control module for logistics transfer within a semiconductor line, as a semiconductor logistics processing system; interlocking a second line facility including a second control module for the logistics transfer as the semiconductor logistics processing system with the first line facility; and performing the logistics transfer by the OHT unit between the first line facility and the second line facility, wherein the OHT unit is controlled in an auto routing method under the control of the main control unit for logistics transfer in a direct method between the first line facility and the second line facility.

An intermediate facility through which the OHT unit passes is provided between the first line facility and the second line facility, and the intermediate facility includes an avoidance line for returning the OHT unit to either the first line facility or the second line facility, and a moving line for the OHT unit to depart and arrive between the first line facility and the second line facility.

In addition, the first control module transmits a first work instruction command to proceed with a set work of the OHT unit, receives a first movement request command for putting the OHT unit into the first line facility after transmitting the first work instruction command, and transmits a first movement permission command allowing the putting of the OHT unit after receiving the first move request command.

In addition, the second control module receives a second movement request command for putting the OHT unit into the second line facility, transmits a second movement permission command allowing the OHT unit to be put into the second line facility after receiving the second movement request command, and transmits a second work instruction command so that the OHT unit performs a set work.

In addition, the main control unit operates in a first mode in which an operation of the OHT unit is controlled via the first control module when the OHT unit is located in the first line facility.

In addition, the main control unit operates in a second mode in which the operation of the OHT unit is controlled via the second control module when the OHT unit is located in the second line facility.

In addition, the main control unit checks an operating state between the first control module and the second control module in order for the OHT unit to be operated from one of the first line facility and the second line facility to the other one, and operates in a third mode in which the OHT unit is controlled to operate in a direct method when the operating state satisfies a preset condition.

In addition, the first line facility further includes a first communication module for communication with the OHT unit, the second line facility further includes a second communication module for communication with the OHT unit, and the main control unit checks a communication operating state of each of the first communication module and the second communication module via the first control module and the second control module, and controls the OHT unit to operate between the first line facility and the second line facility when the communication operating state is a normal operating state.

In addition, the main control unit checks a connection state of a first wireless AP of the first communication module via the first control module, checks a connection state of a second wireless AP of the second communication module via the second control module, and prevents the OHT unit from operating in the direct method when at least one of the first wireless AP and the second wireless AP is not connected.

In addition, the main control unit prevents the OHT unit from operating in the first line facility or the second line facility when the communication operating state of at least one of the first communication module and the second communication module is an abnormal operating state.

In addition, the semiconductor logistics processing system further includes a map data providing module providing the OHT unit with first map data including an operation route of the second line facility so that the OHT unit is operable from the first line facility to the second line facility, and providing the OHT unit with second map data including an operation route of the first line facility so that the OHT unit is operable from the first line facility to the second line facility.

In addition, when an update of at least one of the first line facility and the second line facility occurs, the map data providing module provides the updated first map data or the updated second map data corresponding to the update.

According to another aspect of the present disclosure, there is provided a semiconductor line logistics processing system including: a first line facility including a first control module for logistics transfer within a semiconductor line; a second line facility including a second control module for logistics transfer within the semiconductor line; one or more OHT units operated between the first line facility and the second line facility for logistics transfer within the semiconductor line; and a main control unit controlling operation items related to operations of the first line facility, the second line facility, and the OHT unit by an auto routing method, wherein the main control unit operates in a first mode in which the operation of the OHT unit is controlled via the first control module when the OHT unit is located in the first line facility, in a second mode in which the operation of the OHT unit is controlled via the second control module when the OHT unit is located in the second line facility, and in a third mode in which an operating state between the first control module and the second control module is checked in order for the OHT unit to be operated from one of the first line facility and the second line facility to the other one, and the OHT unit is controlled to operate in a direct method when the operating state satisfies a preset condition, the first line facility further includes a first communication module for communication with the OHT unit, the second line facility further includes a second communication module for communication with the OHT unit, and the main control unit checks a communication operating state of each of the first communication module and the second communication module via the first control module and the second control module, and controls the OHT unit to operate between the first line facility and the second line facility when the communication operating state is a normal operating state, the main control unit checks a connection state of a first wireless AP of the first communication module via the first control module, checks a connection state of a second wireless AP of the second communication module via the second control module, and prevents the OHT unit from operating in the direct method when at least one of the first wireless AP and the second wireless AP is not connected, and the main control unit prevents the OHT unit from operating in the first line facility or the second line facility when the communication operating state of at least one of the first communication module and the second communication module is an abnormal operating state.

In addition, the semiconductor line logistics processing system further includes a map data providing unit providing the OHT unit with first map data including an operation route of the second line facility so that the OHT unit is operable from the first line facility to the second line facility, and providing the OHT unit with second map data including an operation route of the first line facility so that the OHT unit is operable from the first line facility to the second line facility, wherein when an update of at least one of the first line facility and the second line facility occurs, the map data providing module provides the updated first map data or the updated second map data corresponding to the update.

According to still another aspect of the present disclosure, there is provided a semiconductor line logistics processing system including: a first line facility including a first control module for logistics transfer within a semiconductor line; a second line facility including a second control module for logistics transfer within the semiconductor line; one or more OHT units operated between the first line facility and the second line facility for logistics transfer within the semiconductor line; and a main control unit controlling operation items related to operations of the first line facility, the second line facility, and the OHT unit by an auto routing method, wherein an intermediate facility through which the OHT unit passes is provided between the first line facility and the second line facility, and the first control module transmits a first work instruction command to proceed with a set work of the OHT unit, receives a first movement request command for putting the OHT unit into the first line facility after transmitting the first work instruction command, and transmits a first movement permission command allowing the putting of the OHT unit after receiving the first move request command, and the second control module receives a second movement request command for putting the OHT unit into the second line facility, transmits a second movement permission command allowing the OHT unit to be put into the second line facility after receiving the second movement request command, and transmits a second work instruction command so that the OHT unit performs a set work.

According to the logistics processing system and method of the present disclosure as described above, there are one or more of the following effects.

According to the present disclosure, in the configuration for the large-scale FAB manufacturing process, the operation (OHT movement, transport response, etc.) of the plurality of OCSs separated from each other may be performed, and the logistics processing in the semiconductor line may be smoothly performed through this.

In addition, the logistics processing in the semiconductor line may be smoothly performed by automating the switching of setting values related to the networks, the maps, and the like.

In addition, the logistics processing in the semiconductor line may be smoothly performed by applying the automated routing.

In addition, the logistics processing in the semiconductor line may be smoothly performed by the operation of OHT such as transfer and transport between different separate facilities in non-stop.

In addition, the OHT may be efficiently operated by real-time relocation of the upper system in response to an increase in an amount of transport in another line. In addition, by reducing input/output time of OHT, the operation rate may be increased and the automatic switching may be possible.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
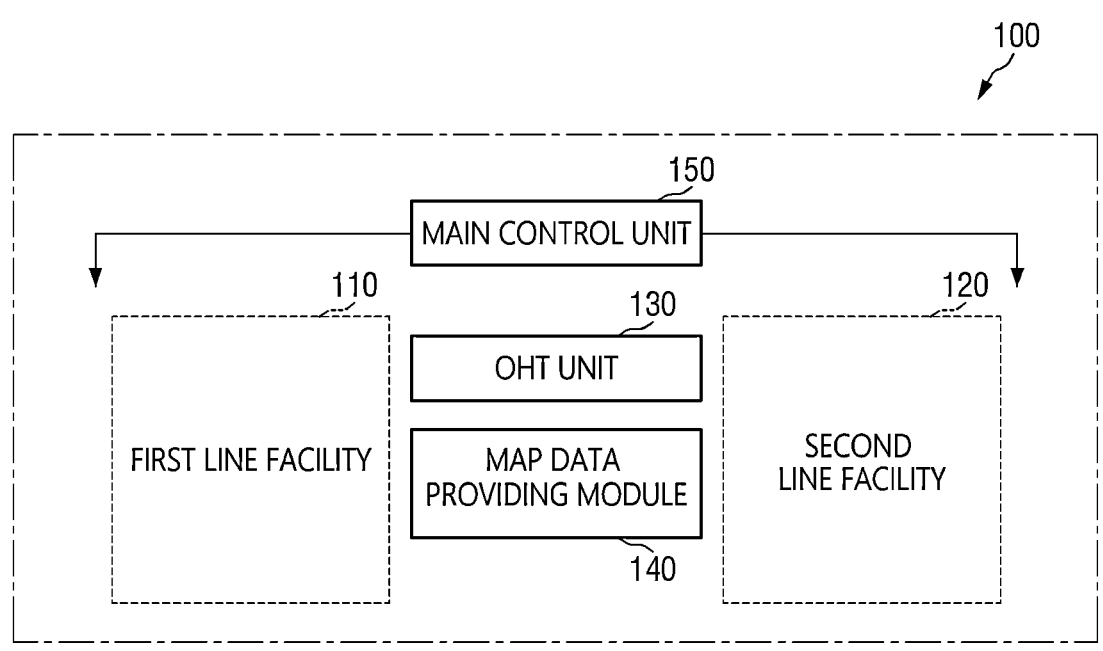
FIG. 1 is a block diagram illustrating configurations of a logistics processing system according to an exemplary embodiment of the present disclosure.

Hereinafter, exemplary embodiments of the present disclosure will be described in detail with reference to the accompanying drawings. Advantages and features of the present disclosure, and a method for achieving the advantages and features will become apparent with reference to the exemplary embodiments described below in detail in conjunction with the accompanying drawings. However, the present disclosure is not limited to the exemplary embodiments disclosed below, but may be implemented in a variety of different forms, these exemplary embodiments will be provided only in order to make the present disclosure complete and allow those skilled in the art to completely recognize the scope of the present disclosure, and the present disclosure is only defined by the scope of the claims. The same reference numbers indicate the same components throughout the specification.

Spatially relative terms "below", "beneath", "lower", "above", "upper", and the like, may be used to easily describe correlations between one target or components and another target or components as illustrated in the drawings. The spatially relative terms are to be understood as terms including different directions of the targets at the time of use or operation in addition to directions illustrated in the drawings. For example, when a target illustrated in the drawing is turned over, a target described as being 'below or beneath' another target may be located 'above' another target. Therefore, an exemplary term 'below' may include both of directions of below and above. The target may also be oriented in other orientations, and thus spatially relative terms may be interpreted according to the orientation.

The terms "first", "second" and the like are used to describe various targets, components, and/or sections but these targets, components, and/or sections are not limited by these terms. These terms are used only in order to distinguish one target, component, or section from another target, component, or section. Accordingly, a first target, a first component, or a first section mentioned below may also be a second target, a second component, or a second section within the spirit of the present disclosure.

The terms used herein are for the purpose of describing the exemplary embodiments and are not intended to limit the present disclosure. In the present specification, a singular form includes a plural form unless explicitly stated otherwise. Components, steps, operations, and/or targets mentioned by terms "comprise" and/or "comprising" used in the present disclosure do not exclude the existence or addition of one or more other components, steps, operations, and/or targets. Unless defined otherwise, all terms (including technical and scientific terms) used in the present specification have the same meaning as meanings commonly understood by those skilled in the art to which the present disclosure pertains. In addition, terms defined in generally used dictionaries are not ideally or excessively interpreted unless specifically defined clearly.

Hereinafter, exemplary embodiments of the present disclosure will be described in detail with reference to the accompanying drawings. In describing the exemplary embodiments of the present disclosure with reference to the accompanying drawings, components that are the same as or correspond to each other will be denoted by the same reference numerals, and an overlapping description thereof will be omitted.

Figure 2:
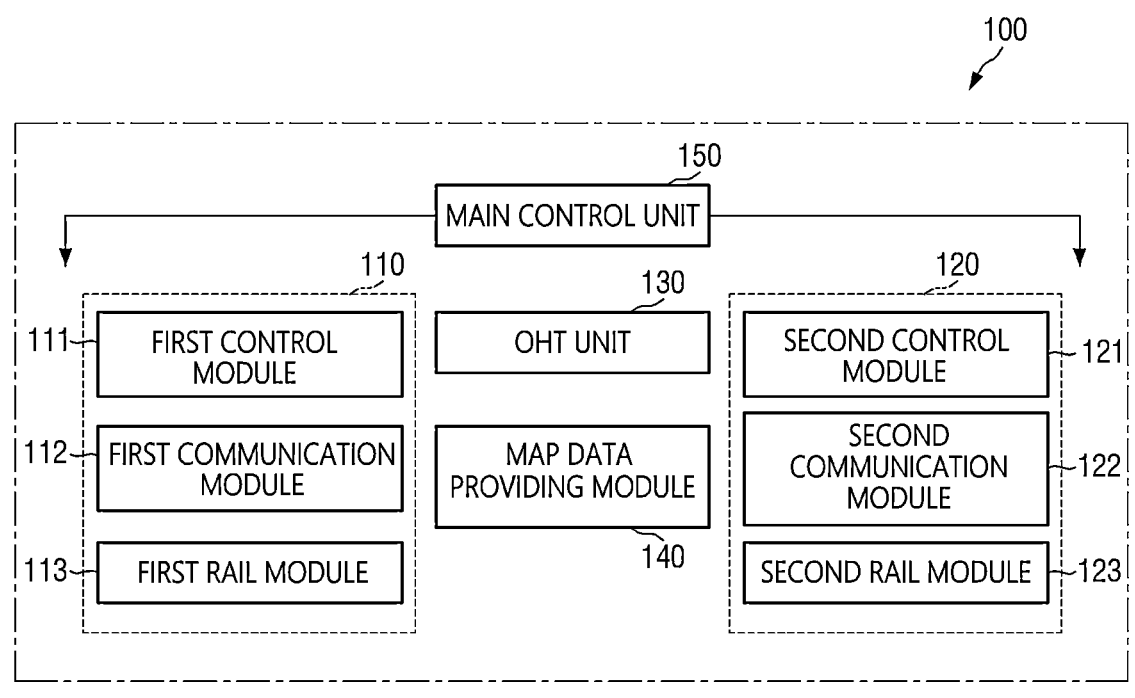
FIG. 2 is a block diagram illustrating the configuration according to FIG. 1 in detail.

Referring to FIGS. 1 and 2, a logistics processing system 100 according to an exemplary embodiment of the present disclosure includes a first line facility 110, a second line facility 120, an OHT unit 130, a map data providing module 140, and a main control unit 150. The first line facility 110 includes a first control module 111, a first communication module 112, and a first rail module 113.

The OHT unit 130 is controlled by an auto routing method under the control of the main control unit 150 for logistics transfer in a direct method between the first line facility 110 and the second line facility 120.

Figure 3:
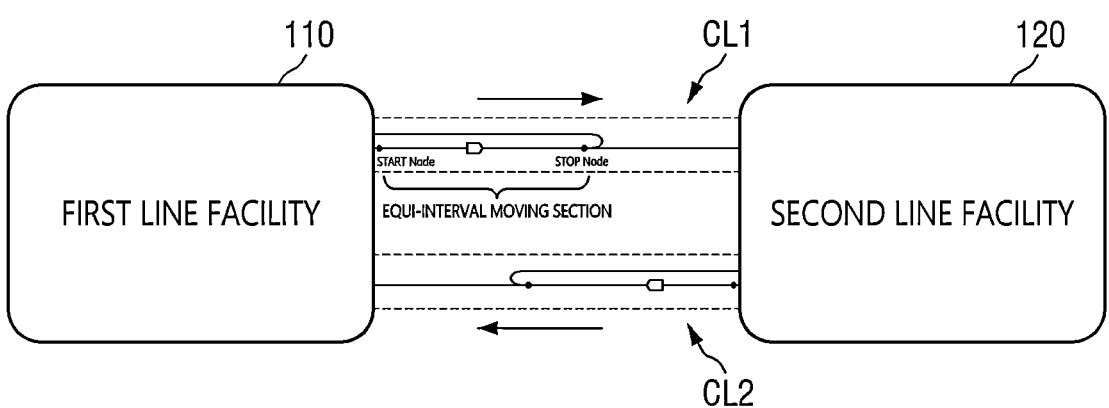
FIG. 3 is a diagram for explaining an operation concept of the configuration according to FIG. 1.

Intermediate facilities C1 and C2 through which the OHT unit 130 passes are provided between the first line facility 110 and the second line facility 120. The intermediate facilities C1 and C2 include an avoidance line and a movement line (see FIG. 3).

Here, the avoidance line is a line for returning the OHT unit 130 to either the first line facility 110 or the second line facility 120.

The movement line is for the OHT unit 130 to depart and arrive between the first line facility 110 and the second line facility 120. Here, the first control module 111 transmits a first work instruction command to proceed with a set work of the OHT unit 130.

Furthermore, the first control module 111 receives a first movement request command for putting the OHT unit 130 into the first line facility 110 after transmitting the first work instruction command.

The first control module 111 transmits a first movement permission command allowing the putting of the OHT unit 130 after receiving the first move request command. A second control module 121 receives a second movement request command for putting the OHT unit 130 into the second line facility 120.

The second control module 121 transmits a second movement permission command allowing the OHT unit 130 to be put into the second line facility 120 after receiving the second movement request command.

The second control module 121 transmits a second work instruction command so that the OHT unit 130 performs a set work. Meanwhile, the second line facility 120 includes a second control module 121, a second communication module 122, and a second rail module 123.

Here, the first control module 111 of the first line facility 110 performs control for logistics transfer within a semiconductor line. The second control module 121 of the second line facility 120 performs control for logistics transfer within the semiconductor line.

Figure 4:
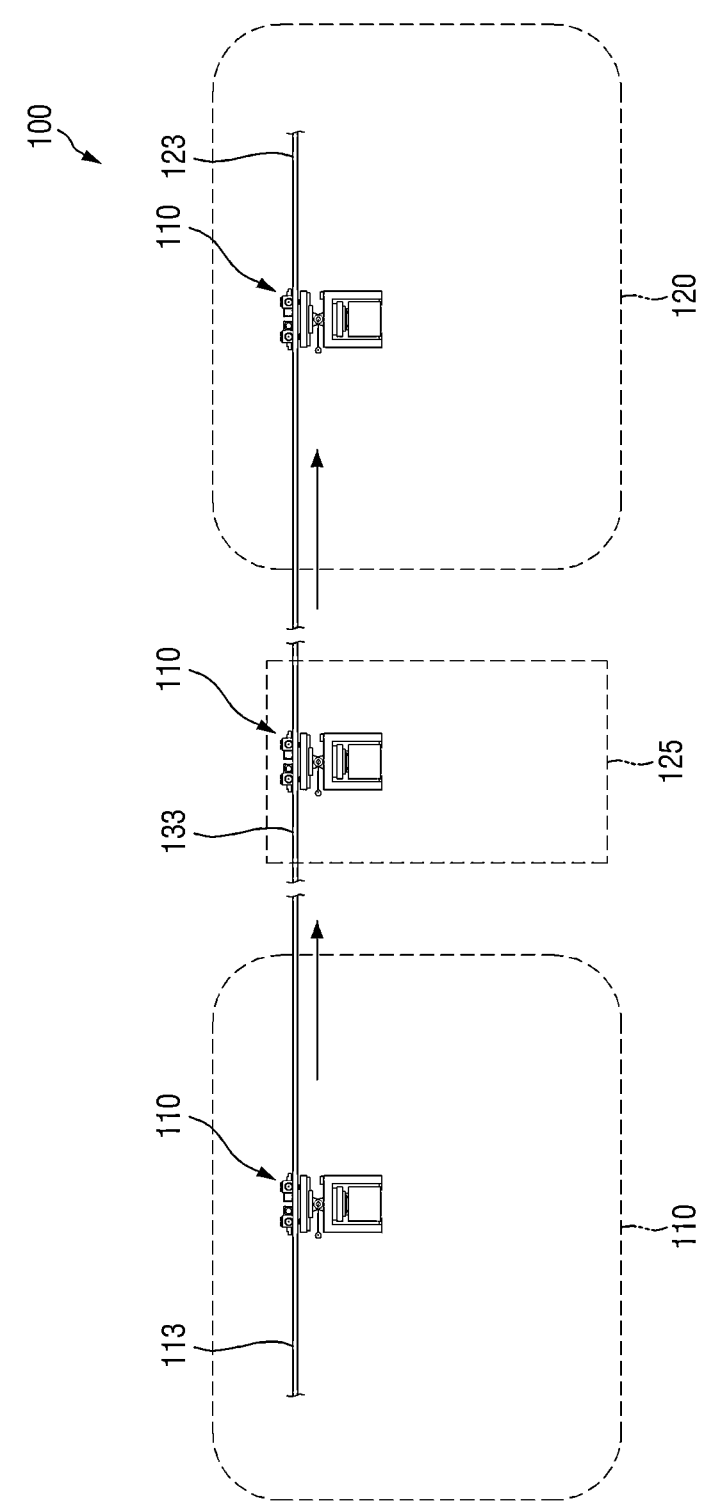
FIGS. 4 to 6 are diagrams illustrating the configuration according to FIG. 1.
Figure 5:
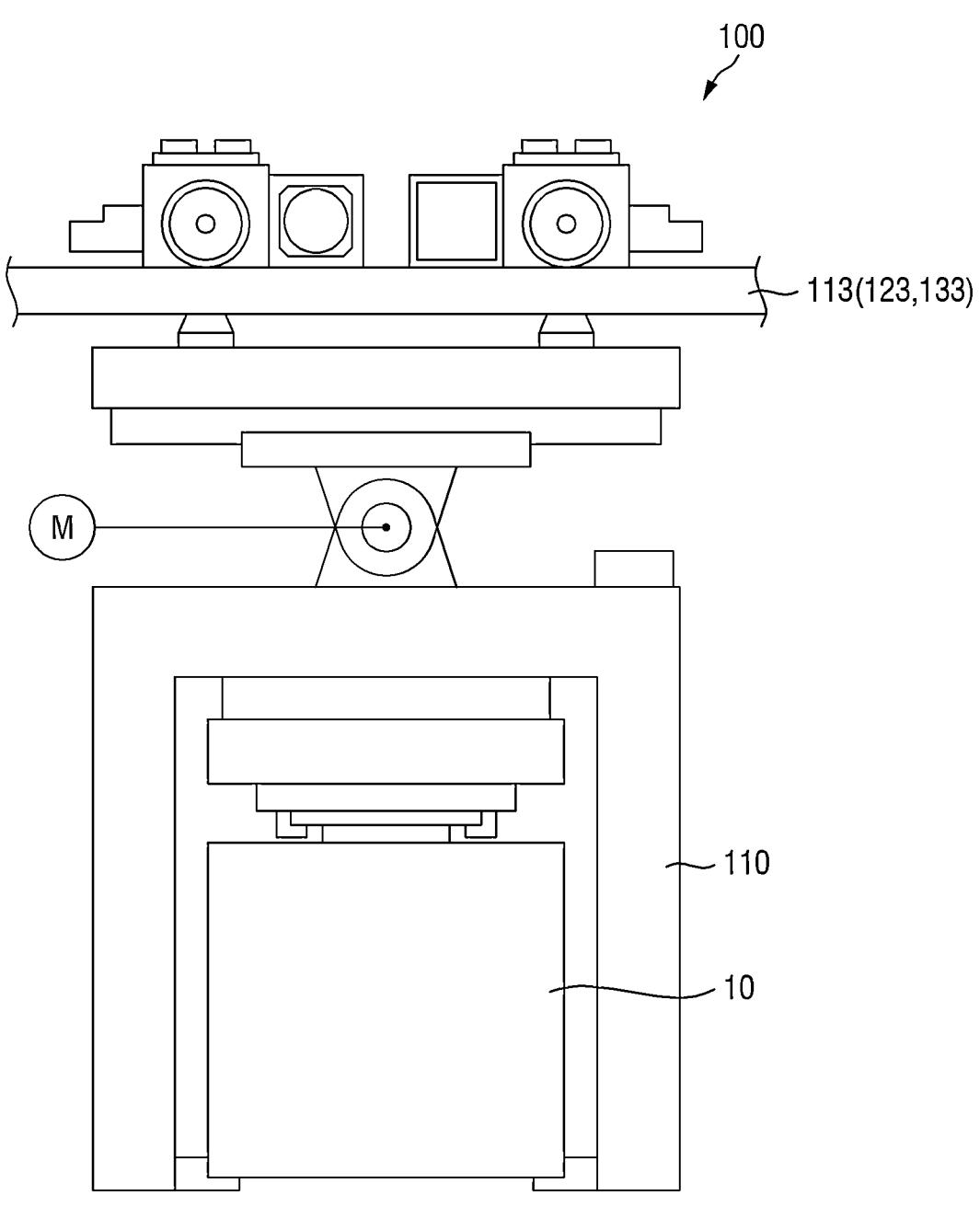
Figure 6:
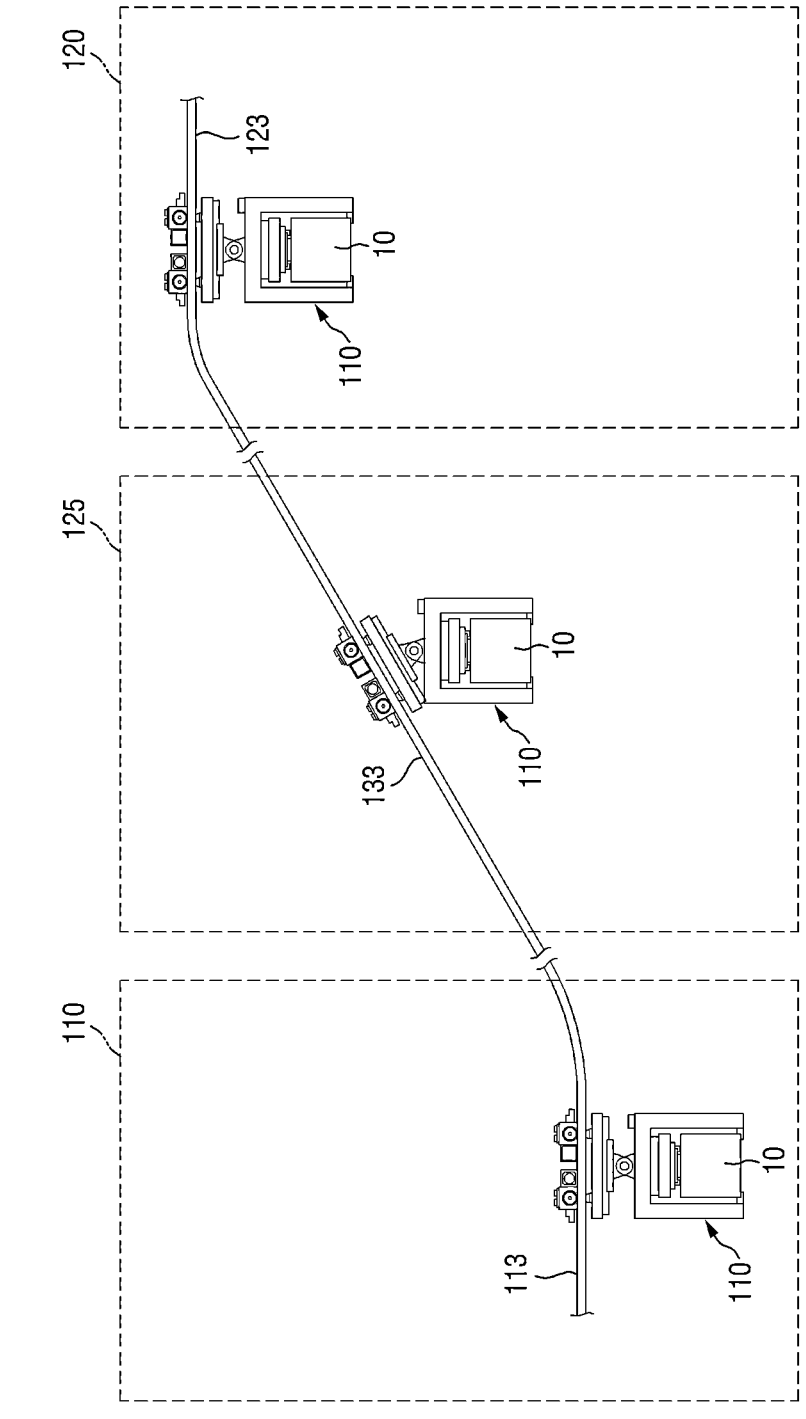

For logistics transfer within the semiconductor line, one or more OHT units 130 operated in a direct method between the first line facility 110 and the second line facility 120 are provided (see FIGS. 4 to 6).

Further, the first communication module 112 of the first line facility 110 is for performing communication with the OHT unit 130. The second communication module 122 of the second line facility 120 is for performing communication with the OHT unit 130.

The main control unit 150 checks a communication operating state of each of the first communication module 112 and the second communication module 122 via the first control module 111 and the second control module 121.

Meanwhile, the main control unit 150 controls the OHT unit 130 to operate between the first line facility 110 and the second line facility 120 when the communication operating state is a normal operating state.

The main control unit 150 controls operation items related to the operations of the first line facility 110, the second line facility 120, and the OHT unit 130. The main control unit 150 controls the operation in a first mode to a third mode.

In the first mode, when the OHT unit 130 is located in the first line facility 110, the operation of the OHT unit 130 is controlled via the first control module 111.

In the second mode, when the OHT unit 130 is located in the second line facility 120, the operation of the OHT unit 130 is controlled via the second control module 121.

Further, in the third mode, in order for the OHT unit 130 to be operated from one of the first line facility 110 and the second line facility 120 to the other one, the operating state between the first control module 111 and the second control module 121 is checked.

In particular, when the operating state satisfies a preset condition, the OHT unit 130 is controlled to operate in the direct method. The main control unit 150 checks a connection state of a first wireless AP on the first communication module 112 via the first control module 111.

The main control unit 150 checks a connection state of a second wireless AP on the second communication module 122 via the second control module 121. The main control unit 150 prevents the OHT unit 130 from operating in the direct method when at least one of the first wireless AP and the second wireless AP is not connected.

Furthermore, the main control unit 150 prevents the OHT unit 130 from operating in the first line facility 110 or the second line facility 120 when the communication operating state of at least one of the first communication module 112 and the second communication module 122 is an abnormal operating state.

The map data providing module 140 provides the OHT unit 130 with first map data including an operation route of the second line facility 120 so that the OHT unit 130 is capable of operating from the first line facility 110 to the second line facility 120.

Here, the map data providing module 140 provides the OHT unit 130 with second map data including an operation route of the first line facility 110 so that the OHT unit 130 is capable of operating from the first line facility 110 to the second line facility 120.

When an update of at least one of the first line facility 110 and the second line facility 120 occurs, the map data providing module 140 provides the updated first map data or the updated second map data corresponding to the update.

Meanwhile, the main control unit 150 manages the operation of the OHT unit 130 in first to fourth operating states via the first control module 111 and the second control module 121.

The second operating state includes bi-directional operation between the first line facility 110 and the second line facility 120. The third operating state includes one-direction operation between the first line facility 110 and the second line facility 120.

Here, the first operating state includes entry and exit between the first line facility 110 and the second line facility 120. The fourth operating state includes a stop or non-stop during operation between the first line facility 110 and the second line facility 120.

Figure 7:
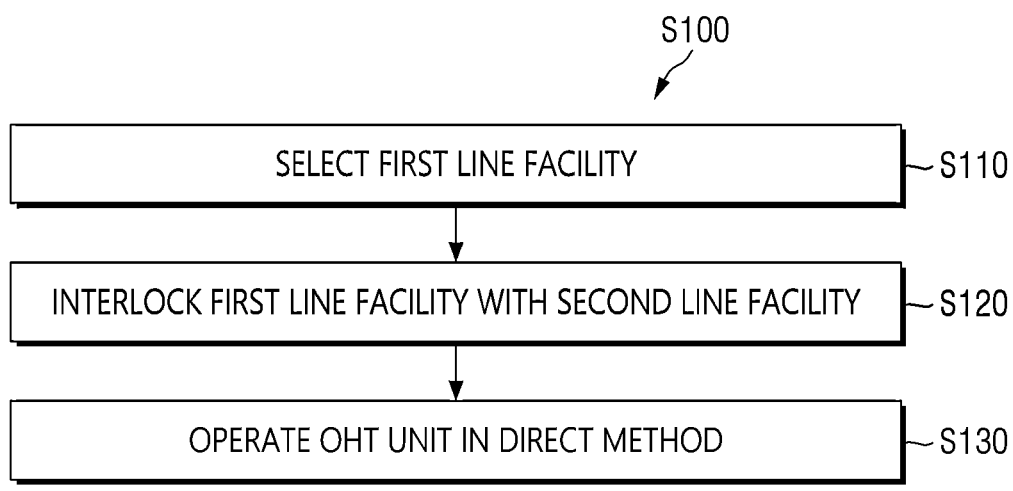
FIG. 7 is a flowchart sequentially illustrating a logistics processing method according to an exemplary embodiment of the present disclosure.

Referring to FIG. 7, in a logistics processing method 5100 within a semiconductor line according to an exemplary embodiment of the present disclosure, a first line facility 110 including a first control module 111 for logistics transfer within the semiconductor line is selected.

Here, a second line facility 120 including a second control module 121 for the logistics transfer is interlocked with the first line facility 110. The OHT unit 130 performs logistics transfer between the first line facility 110 and the second line facility 120 in a direct method.

Furthermore, the OHT unit 130 is controlled by a main control unit 150 interlocking with the first control module 111 and the second control module 121 for the logistics transfer in the direct method.

The main control unit 150 checks whether the first line facility 110 and the second line facility 120 are connected to a wireless AP prior to the operation of the OHT unit 130.

Furthermore, when the wireless AP connection is checked, the OHT unit 130 enters the second line facility 120 from the first line facility 110.

Here, the main control unit 150 provides the OHT unit 130 with first map data including an operation route of the second line facility 120. Furthermore, a plurality of the OHT units 130 may be provided.

When the plurality of OHT units 130 are provided, a dedicated IP is pre-assigned to each of the OHT units 130 in order to prevent a collision between the OHT units 130. The main control unit 150 checks a communication state of the OHT unit 130 with the first line facility and the second line facility 120.

Although the exemplary embodiments of the present disclosure have been described with reference to the accompanying drawings, those of ordinary skill in the art to which the present disclosure pertains will understand that the present disclosure may be embodied in other specific forms without changing the technical spirit or essential features thereof. Therefore, it is to be understood that the exemplary embodiments described above are illustrative rather than being restrictive in all aspects.

What is claimed is:

1. A semiconductor line logistics processing method comprising:

selecting a first line facility including a first control module for logistics transfer within a semiconductor line, as a semiconductor logistics processing system, and a first communication module for communication with the OHT unit;

interlocking a second line facility including a second control module for the logistics transfer as the semiconductor logistics processing system with the first line facility, and a second communication module for communication with the OHT unit; and performing the logistics transfer by the OHT unit between the first line facility and the second line facility, wherein the OHT unit is operated in an auto routing method under the control of the main control unit for logistics transfer in a direct method between the first line facility and the second line facility, wherein the main control unit is configured to:

check a connection state of a first wireless AP of the first communication module via the first control module, check a connection state of a second wireless AP of the second communication module via the second control module, and prevent the OHT unit from operating in the direct method when at least one of the first wireless AP and the second wireless AP is not connected.

2. The semiconductor line logistics processing method of claim 1, wherein an intermediate facility through which the OHT unit passes is provided between the first line facility and the second line facility, and the intermediate facility includes:

an avoidance line for returning the OHT unit to either the first line facility or the second line facility, and a moving line for the OHT unit to depart and arrive between the first line facility and the second line facility.

3. The semiconductor line logistics processing method of claim 1, wherein the first control module:

transmits a first work instruction command to proceed with a set work of the OHT unit, receives a first movement request command for putting the OHT unit into the first line facility after transmitting the first work instruction command, and transmits a first movement permission command allowing the putting of the OHT unit after receiving the first move request command.

4. The semiconductor line logistics processing method of claim 3, wherein the second control module:

receives a second movement request command for putting the OHT unit into the second line facility, transmits a second movement permission command allowing the OHT unit to be put into the second line facility after receiving the second movement request command, and transmits a second work instruction command so that the OHT unit performs a set work.

5. The semiconductor line logistics processing method of claim 1, wherein the main control unit operates in a first mode in which an operation of the OHT unit is controlled via the first control module when the OHT unit is located in the first line facility.

6. The semiconductor line logistics processing method of claim 5, wherein the main control unit operates in a second mode in which the operation of the OHT unit is controlled via the second control module when the OHT unit is located in the second line facility.

7. The semiconductor line logistics processing method of claim 6, wherein the main control unit:

checks an operating state between the first control module and the second control module in order for the OHT unit to be operated from one of the first line facility and the second line facility to the other one, and operates in a third mode in which the OHT unit is controlled to operate in a direct method when the operating state satisfies a preset condition.

8. The semiconductor line logistics processing method of claim 1, wherein the main control unit checks a communication operating state of each of the first communication module and the second communication module via the first control module and the second control module, and controls the OHT unit to operate between the first line facility and the second line facility when the communication operating state is a normal operating state.

9. The semiconductor line logistics processing method of claim 8, wherein the main control unit prevents the OHT unit from operating in the first line facility or the second line facility when the communication operating state of at least one of the first communication module and the second communication module is an abnormal operating state.

10. The semiconductor line logistics processing method of claim 1, wherein the semiconductor logistics processing system further includes a map data providing module providing the OHT unit with first map data including an operation route of the second line facility so that the OHT unit is operable from the first line facility to the second line facility, and providing the OHT unit with second map data including an operation route of the first line facility so that the OHT unit is operable from the first line facility to the second line facility.

11. The semiconductor line logistics processing method of claim 10, wherein when an update of at least one of the first line facility and the second line facility occurs, the map data providing module provides the updated first map data or the updated second map data corresponding to the update.

12. A semiconductor line logistics processing system comprising:

a first line facility including a first control module for logistics transfer within a semiconductor line;

a second line facility including a second control module for logistics transfer within the semiconductor line;

one or more OHT units operated between the first line facility and the second line facility for logistics transfer within the semiconductor line; and a main control unit controlling operation items related to operations of the first line facility, the second line facility, and the OHT unit by an auto routing method, wherein the main control unit operates:

in a first mode in which the operation of the OHT unit is controlled via the first control module when the OHT unit is located in the first line facility, in a second mode in which the operation of the OHT unit is controlled via the second control module when the OHT unit is located in the second line facility, and in a third mode in which an operating state between the first control module and the second control module is checked in order for the OHT unit to be operated from one of the first line facility and the second line facility to the other one, and the OHT unit is controlled to operate in a direct method when the operating state satisfies a preset condition, the first line facility further includes a first communication module for communication with the OHT unit, the second line facility further includes a second communication module for communication with the OHT unit, and the main control unit checks a communication operating state of each of the first communication module and the second communication module via the first control module and the second control module, and controls the OHT unit to operate between the first line facility and the second line facility when the communication operating state is a normal operating state, the main control unit:

checks a connection state of a first wireless AP of the first communication module via the first control module, checks a connection state of a second wireless AP of the second communication module via the second control module, and prevents the OHT unit from operating in the direct method when at least one of the first wireless AP and the second wireless AP is not connected, and the main control unit prevents the OHT unit from operating in the first line facility or the second line facility when the communication operating state of at least one of the first communication module and the second communication module is an abnormal operating state.

13. The semiconductor line logistics processing system of claim 12, further comprising a map data providing unit providing the OHT unit with first map data including an operation route of the second line facility so that the OHT unit is operable from the first line facility to the second line facility, and providing the OHT unit with second map data including an operation route of the first line facility so that the OHT unit is operable from the first line facility to the second line facility, wherein when an update of at least one of the first line facility and the second line facility occurs, the map data providing module provides the updated first map data or the updated second map data corresponding to the update.

14. A semiconductor line logistics processing system comprising:

a first line facility including a first control module for logistics transfer within a semiconductor line, and a first communication module for communication with the OHT unit;

a second line facility including a second control module for logistics transfer within the semiconductor line, and a second communication module for communication with the OHT unit;

one or more OHT units operated between the first line facility and the second line facility for logistics transfer within the semiconductor line; and a main control unit controlling operation items related to operations of the first line facility, the second line facility, and the OHT unit by an auto routing method, wherein an intermediate facility through which the OHT unit passes is provided between the first line facility and the second line facility, and the first control module:

transmits a first work instruction command to proceed with a set work of the OHT unit, receives a first movement request command for putting the OHT unit into the first line facility after transmitting the first work instruction command, and transmits a first movement permission command allowing the putting of the OHT unit after receiving the first move request command, and the second control module:

receives a second movement request command for putting the OHT unit into the second line facility, transmits a second movement permission command allowing the OHT unit to be put into the second line facility after receiving the second movement request command, and transmits a second work instruction command so that the OHT unit performs a set work, and the main control unit is configured to:

check a connection state of a first wireless AP of the first communication module via the first control module, check a connection state of a second wireless AP of the second communication module via the second control module, and prevent the OHT unit from operating in the direct method when at least one of the first wireless AP and the second wireless AP is not connected.

* * * * *